(12) United States Patent
Liu et al.

(10) Patent No.: US 6,775,627 B1
(45) Date of Patent: Aug. 10, 2004

(54) METHOD AND/OR SOFTWARE FOR DETERMINING THE CAPACITANCE OF AN ANALOG/MIXED SIGNAL CIRCUIT

(75) Inventors: Zhiwu Liu, San Jose, CA (US); Barry A. Boes, II, Austin, TX (US); Dinesh Maheshwari, Fremont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/442,715

(22) Filed: Nov. 18, 1999

(51) Int. Cl.$^7$ .............................................. G01R 27/26
(52) U.S. Cl. ..................... 702/65; 324/658; 324/677
(58) Field of Search ................................ 324/658, 677, 324/678, 548, 765; 702/194, 199

(56) References Cited

U.S. PATENT DOCUMENTS 4,617,512 A * 10/1986 Horner ........................ 324/60
5,744,964 A * 4/1998 Sudo et al. .................. 324/537
5,844,412 A * 12/1998 Norton ......................... 324/548

FOREIGN PATENT DOCUMENTS

DE          4334630     * 4/1995  .................. 19/165

* cited by examiner

Primary Examiner—Marc S. Hoff
Assistant Examiner—Paul Kim
(74) Attorney, Agent, or Firm—Christopher P. Maiorana, P.C.

(57) ABSTRACT

A method for determining the capacitance of an analog/mixed signal circuit, comprising the steps of (A) acquiring a capacitance at a plurality of different input slope rates, (B) verifying each acquired capacitance, (C) determining an average capacitance of said plurality of different input slope rates over a partial average range and (D) determining an accuracy of the capacitance.

18 Claims, 4 Drawing Sheets

METHOD AND/OR SOFTWARE FOR DETERMINING THE CAPACITANCE OF AN ANALOG/MIXED SIGNAL CIRCUIT

FIELD OF THE INVENTION

The present invention relates to a method and/or software for accurate capacitance acquisition generally and, more particularly, to a method and/or software for determining the capacitance of an analog/mixed signal circuit.

BACKGROUND OF THE INVENTION

There are several conventional methods for CMOS cell input pin capacitance acquisition. Bipolar junction transistor BJT-CML technology requires additional special characteristics in order to determine the capacitance. The characteristics for determining the capacitance in BJT-CML technology is not clear. The conventional methods for CMOS cell capacitance acquisition is not suitable for BJT-CML cell capacitance acquisition. Currently, conventional approaches are not available for BJT-CML cell input pin capacitance acquisition.

Referring to FIG. 1, a conventional circuit 10 that is used for pin capacitance acquisition is shown. The voltages across the pin capacitance are defined by the following equation EQ1:

$$v = V(1 - e^{-t/RC}) \qquad \text{EQ1}$$

By definition, the RC time constant $\tau$ is the product of R and C and is defined by the following equation EQ2:

$$\tau = RC \qquad \text{EQ2}$$

At time $t = \tau$ the voltage v is defined by the following equation EQ3:

$$v = V(1 - e^{-t/RC}) = 0.63V \qquad \text{EQ3}$$

Using a known value of R and measuring the value of t at which the charging voltage v is 0.63 V, the pin capacitance is found by the following equation EQ4:

$$C = t/R \qquad \text{EQ4}$$

Referring to FIG. 2, a graph illustrating voltage versus time of the circuit 10. The circuit 10 is sensitive to the value of R. The acquired capacitance by this method for the same pin could have 100% to 1000% variation with different values R.

Another conventional method for CMOS cell capacitance acquisition, a so-called an imaginary current method, may be defined by the following equations:

$$V/l_m = 1/(WC)$$

$$W = 2\pi f$$

$$C = l_m/(2\pi f V) \text{ (when } V=1v)$$

$$= l_m/(2\pi f)$$

Using a known value of stimulus frequency f, and measuring the value of imaginary current $l_m$, the pin capacitance can be acquired. However, the imaginary current method is very sensitive to the choice of the stimulus frequency f. The acquired capacitance by this method for the same pin could have up to 1000% variation based on different values of the stimulus frequency f.

Another conventional approach for CMOS cell capacitance acquisition, a so-called impedance method, may be defined by the following equations:

$$Z = (R^2 + (WC)^{-2})^{1/2}$$

$$Z^2 = R^2 + (WC)^{-2} (W = 2\pi f)$$

$$C^2 = (1/(2\pi f Z))^2 \cdot ((WCR)^2 + 1)$$

$$\tan \phi = (1/(WCR))$$

$$C = (1/(2\pi f Z)) \cdot ((\tan \phi)^{-2} + 1)^{1/2}$$

When R is small, WCR<<1, $$C = (1/(2\pi f Z))$$

$$Z = V_{rms}/l_{rms}$$

Using a known value for the stimulus frequency f, and measuring the value of $V_{rms}$ and $l_{rms}$, the pin capacitance can be acquired. The impedance method is also very sensitive to the choice of the stimulus frequency f. The acquired capacitance calculated by the impedance method for the same pin could have up to 1000% variation based on different values of f.

Another conventional method for CMOS cell capacitance acquisition is a so-called I/(DV/DT) method. By definition, capacitance C is defined by the following equation:

$$C = dQ/dV$$

On the other hand, $$dQ = I \cdot dt$$

$$dQ = C \cdot dV = I \cdot dt$$

$$C = I/(dV/dt)$$

where V is input stimulus voltage. If a linear source voltage is used, dV/dt is a constant.

$$K = dV/dt$$

$$C = I/K$$

Take average in the range T, $$(\int_o^T C dt)/T = ((\int_o^T I dt)/T) \cdot (1/K)$$

$$\text{Avg}(C) = \text{Avg}(I)/K$$

Measure Avg(I)→Avg(C)→C

FIG. 3 is a graph illustrating voltage as an input and current as an output, each versus time for the I/(DV/DT) method. The I/(DV/DT) method is still sensitive to input slope rate K for analog signals (BJT-CML), but may provide better tolerance (e.g., −50% to 50%) than other conventional methods.

None of the conventional methods described is targeted to bi-cmos technology. Additionally, the conventional methods described are not normally accurate enough for input pin capacitance acquisition.

SUMMARY OF THE INVENTION

The present invention concerns a method for determining the capacitance of an analog/mixed signal circuit, comprising the steps of (A) acquiring a capacitance at a plurality of different input slope rates, (B) verifying each acquired capacitance, (C) determining an average capacitance of said plurality of different input slope rates over a partial average range and (D) determining an accuracy of the capacitance.

The objects, features and advantages of the present invention include providing a method and/or software that may allow for (i) capacitance acquisition of BJT-CML cells, and/or (ii) characterization of a BJT-CML cell library.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENT

Figure 4A:
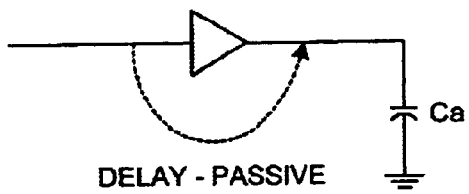
FIGS. 4(a)–(b) are circuit diagrams illustrating a context for a preferred embodiment of the present invention.
Figure 4B:
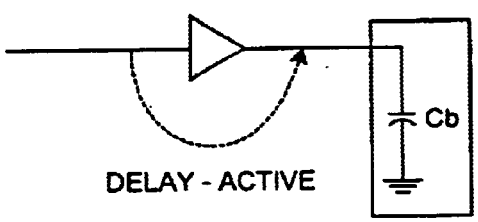

Referring to FIGS. 4a and 4b, block diagrams of a circuit 100a and a circuit 100b are shown in accordance with a preferred embodiment of the present invention.

Figure 1:
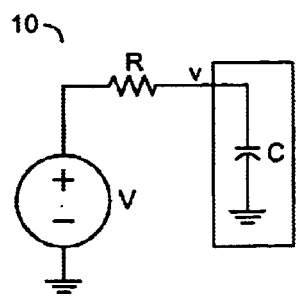
FIG. 1 is a conventional circuit for CMOS cell input capacitance acquisition.
Figure 2:
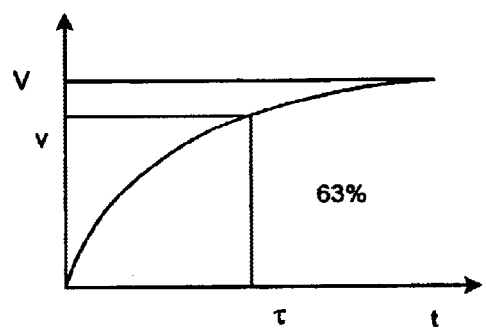
FIG. 2 is a graph of voltage versus time of the circuit of FIG. 1.
Figure 3:
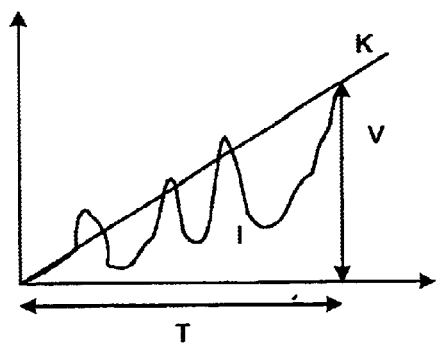
FIG. 3 is a graph of voltage as an input and current as an output, each versus time of another conventional circuit for CMOS cell input capacitance.

In general, a partial T average range performs better than the T average range described in connection with FIG. 3. In one example, the partial T average range may be a ½T range. However, other partial T averages, such as greater than ½T, or more preferably greater than ½T and less than T, may be selected accordingly to meet the design criteria of a particular implementation. For example, a ½T, ¾T, 3/5T (½T+a fraction less than ½), etc. may each be implemented in accordance with the present invention. A passive load capacitance Ca from FIG. 4A is generally used to verify an active load capacitance Cb from FIG. 4b. The partial T average range results may be better than the results of T average range as defined by the following equation EQ5:

$$\mathrm{Avg}(I) = (\int_o^{½T} I dt)/½T \qquad \mathrm{EQ5}$$

In general, the relative error for the acquired capacitance using the present invention is in the range −20% to 20%.

The present invention may still be sensitive to input slope rate K. As a result, the present invention may also provide analysis of a wide variety of ranges. All the capacitances Cb acquired at the M different slope rates K are generally verified with a passive load in the whole input slope range, after which the N best values of capacitance are selected.

The following steps outline the general operation of the present invention:

1. Capacitance Cb acquisition at M input slope rates.

Input slope sweeps m points (i.e., 0.05e-09, 0.2e-09, 0.5e-09, 1.0e-09, 2.0e-09, 3.0e-09, etc. dv/dt). M capacitances Cb may be acquired in M simulations.

2. Verifying each acquired capacitance Cb with N input slope rates applied to M passive capacitances Ca.

The delays (e.g., $\mathrm{DELAY}_{-passive}$) from the M·N passive load simulations of FIG. 4a are compared with an additional N delays (e.g., $\mathrm{DELAY}_{-active}$) from the active load simulations of FIG. 4b. Totally, M·N+N simulations may be performed at the N input slope rates.

$\mathrm{Delay}_{-active} - \mathrm{Delay}_{-passive})/\mathrm{Delay}_{-active}$ is the criteria to pick up the N best capacitances. At each of the N input slope rates, a $\mathrm{Delay}_{-passive}$ may be picked to make the criteria smallest.

3. Taking an average. Then take an average of the N capacitances associated with the N picked delays:

$$\mathrm{Avg}(C) = (C_1 + C_2 + \cdots + C_n)/N.$$

Checking the above relative delay criteria at each of the N input slope rates based on the average capacitance Avg (C). In most cases, the average variance is less than 5%.

The modified I/(dv/dt) method of the present invention (e.g., ½T average range method) may provide a suitable method for BJT-CML cell input pin capacitance acquisition among the above four methods. The relative variance based on the acquired capacitance for this method is about 5%.

Figure 5:
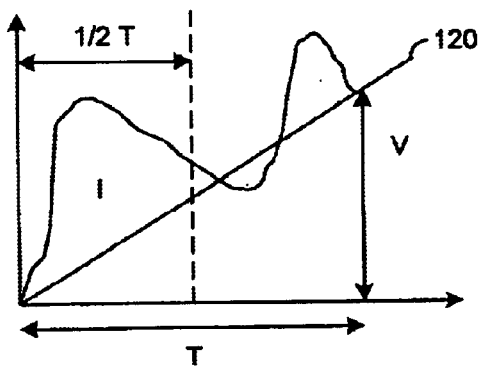
FIG. 5 is a graph of voltage as an input and current as an output, each versus time of the circuits of FIGS. 4(a)–(b)

Referring to FIG. 5, a graph (or plot) of voltage as an input and current as an output, both versus time, is shown. In general, the plot shows an average that somewhat approximates the straight line 120.

Figure 6:
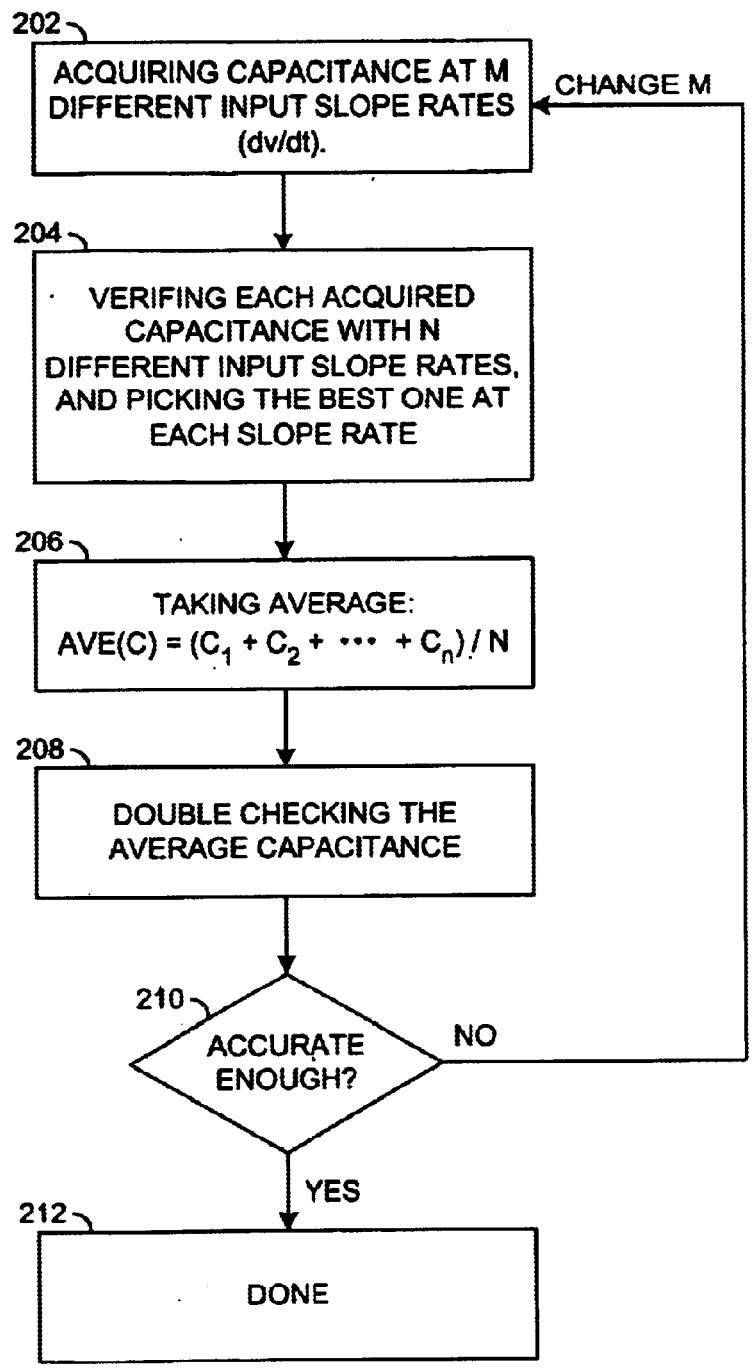
FIG. 6 is a flow diagram illustrating the operation of the circuit of FIG. 4.

Referring to FIG. 6, a flow diagram illustrating the operation of the present invention is shown. The flow diagram 200 generally comprises an acquiring step 202, a verifying step 204, an averaging step 206, a double checking step 208 and an accuracy check step 210. Provided the accuracy check is within tolerance, the method 200 proceeds to the final step 212. If the accuracy is not within tolerances, the method changes the value of M and returns to the acquiring step 202. In general, the acquiring step 202 acquires the capacitances Cb at M different slope rates (e.g., dv/dt). The verifying step 204 generally acquires a delay at N different slope rates for each of the M capacitances. The verifying step also picks the best delay value and associated capacitance at each of the N input slope rates. The averaging step 206 generally takes the average of the best values of capacitance divided by N. The double checking step 208 verifies the average capacitance.

The function performed by the flow diagram of FIG. 6 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

Figure 7:
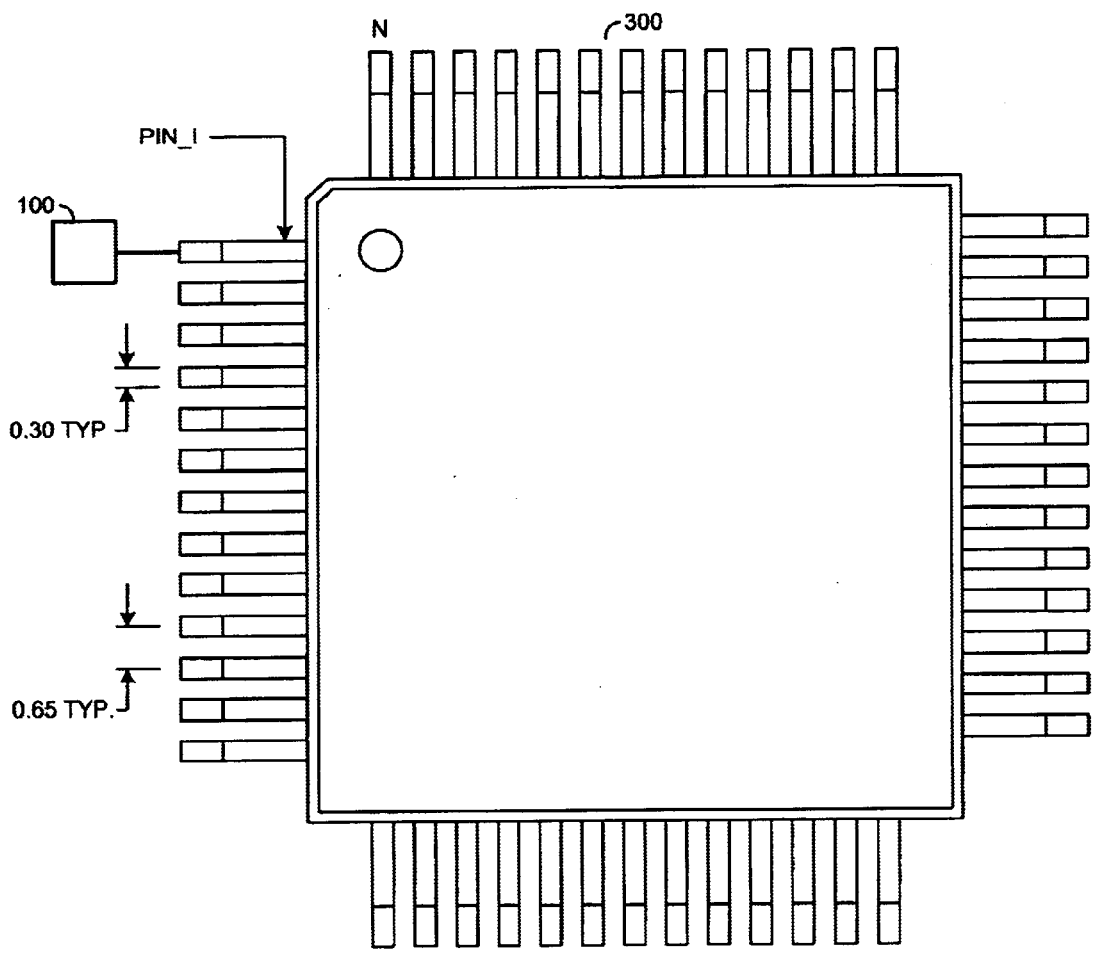
FIG. 7 is a diagram illustrating an implementation of the present invention in the context of an integrated circuit.

Referring to FIG. 7, a diagram illustrating an implementation of the present invention in the context of an integrated circuit 300 is shown. The integrated circuit 300 is shown having a pin (e.g., PIN__1) that may be connected to the circuit 100. The circuit 100 may be used to determine the capacitance of the pin PIN__1.

While the invention has been particularly shown and described with reference to the preferred embodiments thereof, it will be understood by those skilled in the art that various changes in form and details may be made without departing from the spirit and scope of the invention.

What is claimed is:

1. A method for determining an input capacitance of a circuit, comprising the steps of:
   (A) acquiring a plurality of first capacitances at a plurality of first input slope rates;
   (B) verifying each of said first capacitances with a plurality of second input slope rates to determine a plurality of second capacitances; and
   (C) determining said input capacitance by averaging said second capacitances.

2. The method according to claim 1, further comprising the step of:
   determining an accuracy of said input capacitance; and
   repeating steps, (A), (B), and (C) if said accuracy is inaccurate.

3. The method according to claim 1, wherein step (A) further comprises:
   running a plurality of simulations.

4. The method according to claim 1, wherein step (B) further comprises the sub-step of:
   determining a first delay at each of said second input slope rates for said circuit.

5. The method according to claim 4, wherein step (B) further comprises the sub-step of:
   determining a second delay at each of said first capacitances at each of said second input slope rates.

6. The method according to claim 1, wherein step (A) comprises the sub-step of:
   measuring a current for said input capacitance over a partial voltage range that is at least one-half of a full voltage range for said circuit.

7. The method according to claim 5, wherein step (B) further comprises the sub-step of:
   comparing said first delays with said second delays to determine said second capacitances.

8. A computer readable medium containing instructions for determining:
   (A) acquiring a plurality of first capacitances at a plurality of first input slope rates;
   (B) verifying each of said first capacitances with a plurality of second input slope rates to determine a plurality of second capacitances; and
   (C) determining an input capacitance of a circuit by averaging said second capacitances.

9. The computer readable medium according to claim 8, further comprising the step of:
   determining an accuracy of said input capacitance; and
   repeating steps (A), (B), and (C) if said accuracy is inaccurate.

10. The computer readable medium according to claim 8, wherein step (A) further comprises:
    running a plurality of simulations.

11. The computer readable medium according to claim 8, wherein step (B) further comprises the sub-step of:
    determining a first delay at each of said second input slope rates for said circuit.

12. The computer readable medium according to claim 11, wherein step (B) further comprises the sub-step of:
    determining a second delay at each of said first capacitances at each of said second input slope rates.

13. The computer readable medium according to claim 8, wherein step (A) comprises the sub-step of:
    measuring a current for said input capacitance over a partial voltage range that is at least one-half of a full voltage range for said circuit.

14. The computer readable medium according to claim 12, wherein step (B) further comprises the sub-step of:
    comparing said first delays with said second delays to determine said second capacitances.

15. A method for determining an input capacitance of a circuit, comprising the steps of:
    (A) acquiring a plurality of first capacitances at a plurality of first input slope rates;
    (B) verifying each of said first capacitances with a plurality of second input slope rates;
    (C) selecting a number of said second input slope rates in response to a relative delay at each of said second input slope rates to determine a plurality of second capacitances; and
    (D) determining said input capacitance by averaging said second capacitances.

16. The method according to claim 15, further comprising the step of:
    determining an accuracy of said input capacitance; and
    repeating steps (A), (B), (C), and (D) if said accuracy is inaccurate.

17. The method according to claim 15, wherein step (A) comprises the sub-step of:
    measuring a current for said input capacitance over a partial range that is at least one-half of a full range.

18. The method according to claim 15, wherein step (B) further comprises the sub-step of:
    comparing a plurality of first delays from passive load simulations with a plurality of second delays from active load simulations to determine said second capacitances.

* * * * *